(12) United States Patent
Curtis et al.

(10) Patent No.: US 8,021,641 B2
(45) Date of Patent: Sep. 20, 2011

(54) METHODS OF MAKING COPPER SELENIUM PRECURSOR COMPOSITIONS WITH A TARGETED COPPER SELENIDE CONTENT AND PRECURSOR COMPOSITIONS AND THIN FILMS RESULTING THEREFROM

(75) Inventors: Calvin J. Curtis, Lakewood, CO (US); Alexander Miedaner, Boulder, CO (US); Marinus Franciscus Antonius Maria van Hest, Lakewood, CO (US); David S. Ginley, Evergreen, CO (US); Jennifer Leisch, Denver, CO (US); Matthew Taylor, West Simsbury, CT (US); Billy J. Stanbery, Austin, TX (US)

(73) Assignees: Alliance for Sustainable Energy, LLC, Golden, CO (US); Heliovolt Corporation, Austin, TX (US)

( * ) Notice: Subject to any disclaimer, the term of this patent is extended or adjusted under 35 U.S.C. 154(b) by 0 days.

(21) Appl. No.: 12/658,204

(22) Filed: Feb. 4, 2010

(65) Prior Publication Data
US 2011/0189080 A1    Aug. 4, 2011

(51) Int. Cl.
  *B05D 3/02*  (2006.01)
  *B32B 9/00*  (2006.01)
  *C01B 19/04*  (2006.01)
  *H01L 31/00*  (2006.01)
(52) U.S. Cl. .............. 423/508; 423/509; 427/376.6; 428/689; 136/264
(58) Field of Classification Search .............. 423/508, 423/509; 427/376.6; 428/689; 136/264
See application file for complete search history.

(56) References Cited

U.S. PATENT DOCUMENTS

| | | | |
|---|---|---|---|
| 3,014,779 A * | 12/1961 | Conn et al. .............. 423/509 |
| 3,629,036 A | 12/1971 | Isaacson |
| 4,088,544 A | 5/1978 | Hutkin |
| 4,267,398 A | 5/1981 | Rothwarf |
| 4,315,097 A | 2/1982 | Solomon |
| 4,322,571 A | 3/1982 | Stanbery |
| 4,392,451 A | 7/1983 | Mickelsen et al. |
| 4,479,847 A | 10/1984 | McCaldin et al. |
| 4,523,051 A | 6/1985 | Mickelsen et al. |
| RE31,968 E | 8/1985 | Mickelsen et al. |
| 4,571,448 A | 2/1986 | Barnett |
| 4,609,820 A | 9/1986 | Miyamoto |
| 4,611,091 A | 9/1986 | Choudary et al. |

(Continued)

FOREIGN PATENT DOCUMENTS

DE    42 25 385    2/1994

(Continued)

OTHER PUBLICATIONS

Vincent Dusastre et al. "Convenient, room-temperature, amine-assisted routes to metal sulfides, selenides and tellurides" J. Chem. Soc., Dalton Trans., pp. 3505-3508 (1997).*

(Continued)

*Primary Examiner* — Timothy Vanoy
(74) *Attorney, Agent, or Firm* — Watov & Kipnes, P.C.

(57) ABSTRACT

Precursor compositions containing copper and selenium suitable for deposition on a substrate to form thin films suitable for semi-conductor applications. Methods of forming the precursor compositions using primary amine solvents and methods of forming the thin films wherein the selection of temperature and duration of heating controls the formation of a targeted species of copper selenide.

30 Claims, 5 Drawing Sheets

U.S. PATENT DOCUMENTS

| | | |
|---|---|---|
| 4,674,434 A | 6/1987 | Ishihara |
| 4,823,176 A | 4/1989 | Baliga et al. |
| 4,864,599 A | 9/1989 | Saegusa et al. |
| 4,902,395 A | 2/1990 | Yoshimura |
| 4,902,398 A | 2/1990 | Homstad |
| 4,902,668 A | 2/1990 | Whitcomb et al. |
| 5,028,274 A | 7/1991 | Basol et al. |
| 5,055,150 A | 10/1991 | Rosenfeld et al. |
| 5,124,308 A | 6/1992 | Albin et al. |
| 5,178,967 A | 1/1993 | Rosenfeld et al. |
| 5,248,621 A | 9/1993 | Sano |
| 5,298,449 A | 3/1994 | Kikuchi |
| 5,396,839 A | 3/1995 | Rice |
| 5,405,802 A | 4/1995 | Yamagata et al. |
| 5,436,204 A | 7/1995 | Albin et al. |
| 5,441,897 A | 8/1995 | Noufi et al. |
| 5,477,088 A | 12/1995 | Rockett et al. |
| 5,477,288 A | 12/1995 | Miyazaki et al. |
| 5,567,469 A | 10/1996 | Wada et al. |
| 5,578,503 A | 11/1996 | Karg et al. |
| 5,626,688 A | 5/1997 | Probst et al. |
| 5,674,555 A | 10/1997 | Birkmire et al. |
| 5,687,218 A | 11/1997 | Nakayama |
| 5,705,011 A | 1/1998 | Bodford et al. |
| 5,730,852 A | 3/1998 | Bhattacharya et al. |
| 5,731,031 A * | 3/1998 | Bhattacharya et al. ......... 427/76 |
| 5,756,240 A | 5/1998 | Roberts et al. |
| 5,759,954 A | 6/1998 | Taguchi et al. |
| 5,794,163 A | 8/1998 | Paterson et al. |
| 5,846,638 A | 12/1998 | Meissner |
| 5,858,121 A | 1/1999 | Wada et al. |
| 5,858,628 A | 1/1999 | Yoshida et al. |
| 5,948,176 A | 9/1999 | Ramanathan et al. |
| 6,021,207 A | 2/2000 | Puthuff et al. |
| 6,026,082 A | 2/2000 | Astrin |
| 6,072,818 A | 6/2000 | Hayakawa |
| 6,100,165 A | 8/2000 | Sakaguchi et al. |
| 6,121,541 A | 9/2000 | Arya |
| 6,141,356 A | 10/2000 | Gorman |
| 6,146,979 A | 11/2000 | Henley et al. |
| 6,185,418 B1 | 2/2001 | MacLellan et al. |
| 6,187,653 B1 | 2/2001 | Hui et al. |
| 6,190,453 B1 | 2/2001 | Boydston et al. |
| 6,225,190 B1 | 5/2001 | Bruel et al. |
| 6,225,199 B1 | 5/2001 | Han et al. |
| 6,251,754 B1 | 6/2001 | Ohshima et al. |
| 6,313,479 B1 | 11/2001 | Zhang et al. |
| 6,323,417 B1 | 11/2001 | Gillespie et al. |
| 6,339,695 B1 | 1/2002 | Clark |
| 6,372,538 B1 | 4/2002 | Wendt et al. |
| 6,399,486 B1 | 6/2002 | Chen et al. |
| 6,455,398 B1 | 9/2002 | Fonstad, Jr. et al. |
| 6,475,354 B1 | 11/2002 | Toyama |
| 6,500,733 B1 | 12/2002 | Stanbery |
| 6,521,511 B1 | 2/2003 | Inoue et al. |
| 6,559,372 B2 | 5/2003 | Stanbery |
| 6,593,213 B2 | 7/2003 | Stanbery |
| 6,669,830 B1 | 12/2003 | Inoue et al. |
| 6,720,239 B2 | 4/2004 | Stanbery |
| 6,736,986 B2 | 5/2004 | Stanbery |
| 6,787,012 B2 | 9/2004 | Stanbery |
| 6,797,874 B2 | 9/2004 | Stanbery |
| 6,852,920 B2 | 2/2005 | Sager et al. |
| 6,855,202 B2 | 2/2005 | Alivisatos et al. |
| 6,881,647 B2 | 4/2005 | Stanbery |
| 6,936,761 B2 | 8/2005 | Pichler |
| 6,987,071 B1 | 1/2006 | Bollman et al. |
| 7,045,205 B1 | 5/2006 | Sager |
| 7,097,902 B2 | 8/2006 | Blanton et al. |
| 7,422,696 B2 | 9/2008 | Mirkin et al. |
| 2002/0006470 A1 | 1/2002 | Eberspacher et al. |
| 2002/0016188 A1 | 2/2002 | Kashiwamura |
| 2002/0043279 A1 | 4/2002 | Karg |
| 2003/0051664 A1 | 3/2003 | Stanbery |
| 2003/0052391 A1 | 3/2003 | Stanbery |
| 2003/0054582 A1 | 3/2003 | Stanbery |
| 2003/0054662 A1 | 3/2003 | Stanbery |
| 2003/0054663 A1 | 3/2003 | Stanbery |
| 2003/0123167 A1 | 7/2003 | Kolberg et al. |
| 2003/0201010 A1 | 10/2003 | Koyanagi et al. |
| 2004/0063320 A1 | 4/2004 | Hollars |
| 2004/0250848 A1 | 12/2004 | Sager et al. |
| 2005/0095422 A1 | 5/2005 | Sager et al. |
| 2005/0098204 A1 | 5/2005 | Roscheisen et al. |
| 2005/0098205 A1 | 5/2005 | Roscheisen et al. |
| 2005/0109392 A1 | 5/2005 | Hollars |
| 2005/0121068 A1 | 6/2005 | Sager et al. |
| 2005/0183767 A1 | 8/2005 | Yu et al. |
| 2005/0183768 A1 | 8/2005 | Roscheisen et al. |
| 2005/0186342 A1 | 8/2005 | Sager et al. |
| 2005/0218377 A1 | 10/2005 | Lawandy |
| 2006/0062902 A1 | 3/2006 | Sager et al. |
| 2007/0077429 A1 | 4/2007 | Mirkin et al. |
| 2007/0119522 A1 | 5/2007 | Grier et al. |
| 2007/0152236 A1 | 7/2007 | Halpert et al. |
| 2007/0163642 A1 | 7/2007 | Van Duren et al. |
| 2007/0234949 A1 | 10/2007 | Ahn et al. |
| 2007/0261951 A1 | 11/2007 | Ye et al. |
| 2008/0194103 A1 | 8/2008 | Wagner |
| 2008/0242088 A1 | 10/2008 | Suzuki |
| 2009/0226603 A1 | 9/2009 | Lowrey |

FOREIGN PATENT DOCUMENTS

| | | |
|---|---|---|
| EP | 0 381 509 | 8/1990 |
| EP | 0 621 130 | 10/1994 |
| EP | 0 661 760 | 7/1995 |
| EP | 0 763 859 | 3/1997 |
| EP | 0 989 593 | 3/2000 |
| EP | 1 255 305 | 6/2002 |
| EP | 1 385 364 | 1/2004 |
| GB | 1119372 A * | 7/1968 |
| WO | WO 97/22152 | 6/1997 |
| WO | WO 00/33363 | 6/2000 |
| WO | WO 03/002225 | 1/2003 |
| WO | WO 03/026022 | 3/2003 |
| WO | WO 03/026023 | 3/2003 |
| WO | WO 03/026024 | 3/2003 |
| WO | WO 03/026025 | 3/2003 |
| WO | WO 03/026026 | 3/2003 |
| WO | WO 03/026028 | 3/2003 |
| WO | WO 2005/017978 | 2/2005 |
| WO | WO 2005/059952 | 6/2005 |
| WO | WO2006041199 | 4/2006 |
| WO | WO 2006/133129 | 12/2006 |
| WO | WO 2007/082080 | 7/2007 |
| WO | WO 2007/082084 | 7/2007 |
| WO | WO 2007/082085 | 7/2007 |
| WO | WO 2008/027571 | 3/2008 |

OTHER PUBLICATIONS

Anderson, et al, "Processing of CuInSe$_2$-Based Solar Cells: Characterization of Deposition Processes in Terms of Chemical Reaction Analyses", Final Report, May 6, 1995-Dec. 31, 1998, National Renewable Energy Laboratory, pp. 1-400 Jun. 2001.

Arya, et al, "Solar Cells and Submodules on CIS Prepared by EDCF Method", Solarex Corporation, Thin-Film Division, presented at the 23rd IEEE Photovoltaic Conference, pp. 1-4 May 1993.

Braunger, et al. "Influence of sodium on the growth of polycrystalline Cu(ln,Ga)Se2 thin films" Thin Solid Films, Elsevier-Sequoia S. A. Lausanne, Ch. vol. 361-362, Nr. 1, pp. 161-166. 2000.

Burda, et al., "Chemistry and Properties of Nanocrystals of Different Shapes"; Chem. Rev. 2005, 105, 1025-1102.

Cahen, et al, "Room Temperature Tailoring of Electrical Properties of Ternary and Multinary Chalcogenide Semiconductors", Proc. 9th Int. Conf. Ternary and Multinary Compounds, Yokohama, pp. 1-2 Jun. 7, 1993.

Caspar, et al., Five-fold Symmetry in Crystalline Quasicrystal Lattices; Proc. Nat. Acad. Sci. USA, vol. 93, pp. 14271-14278, Dec. 1996.

Chang, et al, "Novel Multilayer Process for CuInSe$_2$ Thin Film Formation by Rapid Thermal Processing", Material Res. Society Symposium Proceedings, vol. 485, pp. 163-168 1998.

Chen et al., Thin Film CuInGeSe2 Cell Development, 1993.

Chun et al., "Synthesis of CuInGaSe2 nanoparticles by solvothermal route," Thin Solid Films, Elsevier-Sequoia S.A. Lausanne, Ch, vol. 480-481, Jun. 1, 2005, pp. 46-49.

Contreras, et al, "Progress Toward 20% Efficiency in Cu(In, Ga)Se.sub.2 Polycrystalline Thin-film Solar Cells," Progress in Photovoltaics Research and Applications, Short Communication: Accelerated Publication, pp. 311-316 Apr. 26, 1999.

Cyganik et al. (Substructure Formation during Pattern Transposition from Substrate into Polymer Blend Film), Europhysics Letters, vol. 62, No. 6, Apr. 29, 2003.

Eberspacher, et al, "Non-Vacuum Techniques for Fabricating Thin-Film CIGS", IEEE, pp. 517-520 2000.

Grisaru, et al., "Microwave-assisted Polyol Synthesis of CuInTe2 and CuInSe2 Nanoparticles"; Inorg. Chem. 2003, 42, 7148-7155.

Gullen, et al, "Reaction Pathways to CuInSe.sub.2 Formation from Electrodeposited Precursors", J. Electrochem. Soc. vol. 142, No. 6, pp. 1834-1838 Jun. 1995.

Hassan, et al, "Evaluation and characterization of polycrystalline CuInSe.sub.2 thin films prepared by the sandwich structure technique", Semiconductor Science Technology, vol. 9, pp. 1255-1260 1994.

Hiraga et al., "Formation of Decagonal Quasicrystal in the Al-Pd-Mn System and its Structure"; Japanese Journal of Applied Physics, vol. 30, No. 9A, pp. 2028-2034, Sep. 1991.

Hollingsworth et al., "Catalyzed Growth of a Metastable InS Crystal Structure as Collidial Crystals", J. Am. Chem. Soc., 2000, 122, 3562-3563.

Hua, et al., "Electroluminescent Propert es of Device Based on ZnS;Tb/CdS Core-shell Nanocrystals"; Chemical Physics Letters 419 (2006) 269-272.

Jiang, et al., "Elemental Solvothermal Reaction to Produce Ternary Semiconductor CuInE2(E=S, Se) Nanorods"; Inorg. Chem. 2000, 39, 2964-2965.

Kazmerski, et al, "Thin-film CuInSe.sub.2 /CdS heterojunction solar cells", Applied Physics Letters, vol. 29, No. 4, pp. 268-270 Aug. 1976.

Keyes et al., "Influence of Na on the Electo-optical properties of Cu(in,Ga)Se2," NREL/CP-530-22963, UC Category: 1250, 1997.

Kumar, et al., "Shape Control of II-VI Semiconductor Nanomaterials"; small 2006, 2, No. 3, 316-329.

Lammasniemi, et al. "Characteristics of Indium Phosphide Solar Cells Bonded in Silicon" Proceedings of the Photovoltaic Specialists Conference, May 10-14, 1993, New York, IEEE, vol. Conf. 23, pp. 763-767.

Lee, W.Y., F. Sequeda, S. J., and D. Chapman, "Field-assisted bonding below 200.degree.0 using metal and glass thin-film interlayers," Applied Physics Letters, vol. 50, pp. 522-524 1987.

Li et al. "Effects of buffer layer processing on CIGS excess carrier lifetime: application of dual-beam optical modulation to process analysis," 0-7803-3166-4/96 IEEE 25$^{th}$ PVSC (May 13-17, 1996) Washington, D.C., pp. 821-824.

Li, et al., "Sonochemical Process for the Preparation of alpha-CuSe Nanocrystals and Flakes"; J. Mater. Chem., 2002, 12, 3723-3727.

Li, et al., "Synthesis by a Solvothermal Route and Characterization of CuInSe2 Nanowhiskers and Nanowhiskers"; Adv. Mater. 1999, 11, No. 17.

Manna, et al., "First-Principles Modeling of Unpassivated and Surfactant-Passivated Bulk Facets of Wurtzite CdSe: A Model System for Studying the Anisotropic Growth of CdSe Nanocrystals"; J. Phys. Chem. B 2005, 109, 6183-6192.

Murray, et al., "Synthesis and Characterization of Monodisperse Nanocrystals and Close-packed Nanoperystal Assemblies"; Annu. Rev. Mater. Sci. 2000, 30: 545-610.

Nakada, et al, "Preparation and Characterization of CuInSe.sub.2 Films for PV Applications by Low Pressure Vapor Phase Selenization," Proceedings of the 11th E.C. Photovoltaic Solar Energy Conference, pp. 794-797 Oct. 12-16, 1992.

Nowlan, et al. "Direct Dover Glass Bonding to GaAs and GaAs/Ge Solar cells" Proceedings of the Photovoltaic Specialists Conference, Law Vegas, Oct. 7-11, 1991, pp. 1480-1484.

Noufi et al. "Chemical-fluctuation-induced nanodomains in Cu(In,Ga)Se2 films," 20th European Photovoltaic Solar Energy Conference, Jun. 6-10, 2005, Barcelona, Spain, pp. 1744-1747.

Park et al., Phase-controlled One-Dimensional Shape Evolution of InSe Nanocrystals; J.Am. Chem. Soc., 2006, 128, 14780-14781.

Peng, et al., "Epitaxial Growth of Highly Luminescent CdSe/CdS Core/Shell Nanocrystals with Photostability and Electronic Accessibility"; J. Am. Chem. Soc. 1997, 7019-7029.

Pinna et al., "Triangular CDS nanocrystals: Structural and Optical Studies", Advanced materials, Wiley Vch, Weiheim, DE, vol. 13, No. 4, Feb. 19, 2001, pp. 261-264.

Probst et al, "Advanced Stacked Elemental Layer Process for Cu(InGa)Se.sub.2 Thin Film Photovoltaic Devices," Mat. Res. Soc. Symp. Proc., vol. 426, pp. 165-176 1996.

Probst et al. "Rapid CIS-process for high efficiency PV-modules: development towards large area processing," Thin Solid Films 387 (2001) pp. 262-267.

Puzder, et al., "The Effect of Organic Ligand Binding on the Growth of CdSe Nanoparticles Probed by Ab Initio Calculations"; Nano Letters 2004, vol. 4, No. 12, 2361-2365.

Revaprasadu et al, "Novel single-molecule precursor routes for the direct synthesis of InS and InSe quantum dots," J. Mater. Chem., 1991, 9, 2885-2888.

Schock, "Thin film protovoltaics," Applied Surface Science, vol. 92, pp. 606-616 1996.

Stanbery, "Copper Indium Selenides and related materials for Photovoltaic Devices," Critical Reviews in Solid State and Material Sciences, 27(2):7-117 (2002).

Stanbery, "The Intra-absorber Junction (IAJ) Model for the Device Physics of Copper Indium Gallium Selenide-based Photovoltaics," 0-7803-8707-4/05, IEEE, presented Jan. 5, 2005, pp. 355-358.

Stanbery et al., "Role of Sodium in the Control of Defect Structures in CIS," 0-7803-5772-8/00 2000 IEEE, pp. 440-445.

Stanbery, et al. "XPS Studies of sodium compound formation and surface segregation in CIGS thin films: Conference record of the 26th IEEE Photovoltaic Specialists Conf.," Oct. 3, 1997, pp. 499-502.

Teheran, et al, "Evolution of the phases and chemical composition during the formation of CIS thin films prepared by interdiffusion process in selenides layers", Journal of Crystal Growth, vol. 183, pp. 352-360 1998.

Tuttle et al., "A 15% AM0/1433 w/kg Thin Film Cu(in, Ga)Se2 Solar Cell for Space Applications," 2000.

Xu, et al., "Sonochemical Synthesis of Copper Selenides Nanocrystals with Different Phases"; Journal of Crystal Growth 234 (2002), 263-266.

Yan et al., "Chemical Fluctuation-induced Nanodomains in Cu(In, Ga)Se2 Films", Applied Physics Letters 87 (2005).

Yang, et al., "The Spectroscopy of InSe Nanoparticles"; J. Phys. Chem. B 2005,109, 12701-12709.

Yin, et al., "Colloidal Nanocrystal Synthesis and the Organic-inorganic Interface"; NATURE, vol. 437, Sep. 29, 2005.

Probst et al., "The Impact of Controlled Sodium Incorporation on Rapid Thermal Processed Cu(InGa)Se$_2$ -Thin Films and Devices," First WCPEC; Dec. 5-9, 1994; Hawaii; CH3365-4/94/0000-0144 IEEE, pp. 144-147.

* cited by examiner

XRD SCANS OF AS-DEPOSITED AND ANNEALED FILMS

METHODS OF MAKING COPPER SELENIUM PRECURSOR COMPOSITIONS WITH A TARGETED COPPER SELENIDE CONTENT AND PRECURSOR COMPOSITIONS AND THIN FILMS RESULTING THEREFROM

CONTRACTUAL ORIGIN

The United States Government has rights in this invention under Contract No. DE-AC36-08GO28308 between the United States Department of Energy and the Alliance Sustainable for Energy, LLC, the Manager and Operator of the National Renewable Energy Laboratory.

INCORPORATION BY REFERENCE

Patent Cooperation Treaty Publication No. WO/2008/063190 published May 29, 2008 (PCT/US2006/060757 filed Nov. 9, 2006) describes precursor compositions for the formation of copper selenide, indium selenide, copper indium selenide (CIS), and/or copper indium gallium diselenide (CIGS) films.

Patent Cooperation Treaty Publication No. WO/2008/057119 published May 15, 2008 (PCT/US2006/060756 filed Nov. 9, 2006) describes the formation of copper indium selenide and/or copper indium gallium selenide films from indium selenide and copper selenide compositions.

The entire text of the aforementioned publications are incorporated herein by reference which collectively disclose the desirability of using liquid-based precursor compositions because of the relatively simple and numerous deposition techniques that may be used to deposit the liquid precursor compositions on substrates as compared to solid state deposition techniques.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

An exemplary process of preparing a precursor liquid based material (i.e. precursor composition) is disclosed having a copper selenide content defined by the formula $Cu_xSe_y$ wherein x and y are each in the range of 1 to 2. Such precursor compositions are suitable for forming thin films on a substrate which may be used, for example, in semi-conductor applications such as for the preparation of absorber layers for solar cells.

The process produces a liquid based material that can be used in deposition techniques that are easier, less expensive, and more efficient to use than solid based deposition techniques such as vacuum deposition. The precursor compositions allow for deposition by such techniques as drop coating, dip coating, spin coating, spraying, brushing, air brushing, stamping, printing, including ink jet printing, pouring, wiping, smearing and other methods of applying liquids to the surface of a substrate.

In addition, the present precursor compositions can be used to produce thin films with additional advantageous properties. First, the films are essentially devoid of oxygen in the form of oxygen-containing compounds. The presence of oxygen, for example in the form of oxygen-containing compounds (e.g. CuO), can lead to defects in the copper selenide film leading to defects in the absorber layer (e.g. CIS or CIGS) which can adversely affect the energy coversion efficiency of a solar panel.

Another advantageous property is obtained from the use of primary amine type solvents (e.g. hydrazine) for dissolving a copper selenide starting material. When copper selenide is dissolved in the primary amine, $Cu_2Se$ precipitates leaving a solution containing copper selenide compounds essentially free of $Cu_2Se$. Such solutions enable the deposition of a precursor composition under thermal conditions, which preferentially deposit thin films having a desirable copper selenide composition (i.e. predominantly CuSe) suitable for the formation of CIS or CIGS thin films useful in the fabrication of solar panels.

Accordingly, an exemplary embodiment is directed to a process of making a precursor composition comprising:

a) combining a solvent comprising a primary amine and a solute comprising copper and selenium to form a preliminary precursor composition in the form of a solution;

b) allowing the preliminary precursor composition to precipitate a non-soluble product comprising $Cu_2Se$; and c) separating the non-soluble product from the preliminary precursor composition to form said precursor composition.

Another embodiment is directed to a precursor composition which comprises:

a solution comprising $CuSe_2$ and a primary amine, substantially devoid of $Cu_2Se$.

In another embodiment, there is provided a precursor composition which comprises:

a solution comprising $CuSe_2$ and hydrazine in which ligands of hydrazine are attached to the $CuSe_2$.

In a still further embodiment, there is provided a thin film useful for the production of an absorber layer for a solar cell comprising $Cu_xSe_y$ having no detectable oxygen containing compounds wherein x and y are each from 1 to 2, and the sum of x+y being in the range of 2-3, preferably where the copper selenide compound is at least substantially CuSe.

In another embodiment, there is provided a method of applying the precursor composition to a substrate comprising depositing a precursor composition comprising $CuSe_2$ and a primary amine, substantially devoid of $Cu_2Se$, at a temperature in which the $CuSe_2$ is converted to a copper selenide having an atomic ratio of selenium of less than about 2:1, preferably about 1:1.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

A precursor composition (also referred to as a precursor ink) is disclosed which is suitable for forming a thin film on a substrate and especially for forming a thin film containing a desired chemical species (e.g. CuSe) for use in forming a CIS (copper-indium-selenide) and/or CIGS (copper-indium/gallium-diselenide) absorber layer for solar cells.

Copper selenide containing thin films are useful in the fabrication of CIS and/or CIGS absorber layers for solar cells. The copper selenide layer and the indium/gallium selenide layer are placed into contact under reactive conditions to form a desirable absorber layer. An exemplary form of copper selenide is CuSe and it is desirable to form a thin film of copper selenide in which a high degree of selection for CuSe is evident.

In an exemplary embodiment, there is provided a process of forming a liquid based precursor composition or precursor ink having a desirable copper selenide content, in which during the process undesirable $Cu_2Se$ is effectively removed prior to deposition. The precursor composition can be applied to a substrate and simultaneously thermally treated in a manner which provides a thin film having a target copper selenide content, preferably predominantly CuSe and most preferably having a substantially 1:1 copper-selenium atomic ratio.

Figure 1:
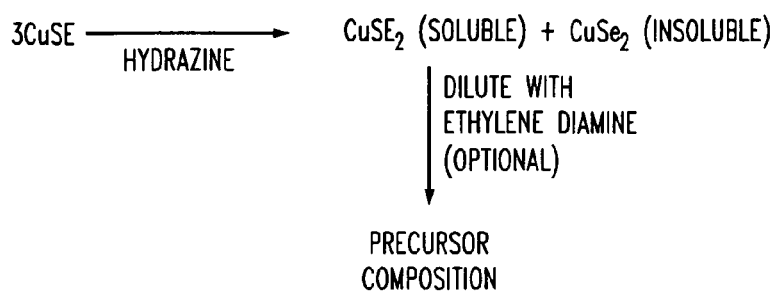
FIG. 1 is a schematic view of a chemical reaction of an embodiment for forming a precursor composition.

An exemplary process as represented by FIG. 1 involves first dissolving a copper selenide starting material, e.g., containing CuSe, in a primary amine solvent such as hydrazine to form a preliminary precursor composition. A precipitate of insoluble $Cu_2Se$ is formed, due to the presence of the primary amine solvent. The precipitate can routinely be removed from the solution, such as by filtration and/or centrifugation, leaving a liquid based precursor composition containing copper selenide substantially devoid of the undesirable species $Cu_2Se$. Because $Cu_2Se$ precipitates out of the solution and can be effectively removed, the resulting solution is substantially devoid of $Cu_2Se$ and therefore can be thermally controlled during deposition to achieve a desirable copper selenide profile.

The resulting precursor composition is applied to the substrate under elevated temperature conditions sufficient to remove the solvent. During this thermal process step, the selection of a deposition temperature and duration of heating controls the species of copper selenide formed during deposition. In this way, the thin film can be formed with at least a substantial, preferably all of the copper selenide in the form of CuSe.

In an exemplary embodiment, there is provided a process for producing a $Cu_xSe_y$ containing precursor composition wherein x and y are each from 1 to 2, with the sum of x+y being in the range of 2-3, comprising dissolving a copper selenide starting material in a solvent comprised of a primary amine such as hydrazine ($N_2H_4$) to form a solution (i.e. preliminary precursor composition) containing $CuSe_2$ and an insoluble precipitate in the form of $Cu_2Se$. The precipitate is removed in a conventional manner (e.g. filtration and/or centrifugation), leaving a copper selenide containing solution at least substantially free of $Cu_2Se$ (i.e. precursor composition) for further processing.

When using hydrazine as a solvent, it is believed that the solution is comprised of a coordination complex of copper, selenium and hydrazine in which ligands of hydrazine are bound to the copper. The solution is applied to a substrate such as glass, plastic, ceramic or the like by any of the liquid based deposition techniques previously mentioned (e.g. spraying), for example at a thickness of from about 0.1 to 5.0 μm.

The precursor composition is heated during or after deposition to remove and recapture the solvent which, in the case of hydrazine, results from the breaking of the ligand bonds between the hydrazine and copper, leaving relatively pure copper selenide.

The temperature and duration of the heating step has been found to control the atomic ratio of copper to selenium when the precursor composition is deposited on the substrate. Relatively high temperatures favor the formation of the copper rich species ($Cu_2Se$). Relatively low temperatures favor the formation of the selenium-rich species ($CuSe_2$). Thus, raising the reaction temperature tends to raise the copper content and lower the selenium content. For example, deposition of the copper selenide precursor composition at a temperature of from about 50 to 150° C., where about 80° C. favors the formation of $CuSe_2$. If deposition is conducted at about 175° C. to 225° C., e.g., about 200° C., the predominant species is CuSe. As temperatures rise above about 225° C., the copper selenide precursor composition gradually favors the formation of the undesirable $Cu_2Se$. Accordingly, by controlling the temperature of the deposition process within the temperature range described above, the content of the copper selenide compounds can be precisely controlled.

In the formation of CIS and CIGS absorption layers, copper selenide layers containing substantially pure CuSe may be used. Accordingly, an exemplary method of forming a CIS or CIGS absorption layer is to deposit the copper selenide layer at a temperature of from about 150° C. to 225° C., preferably about 200° C.

Figure 3:
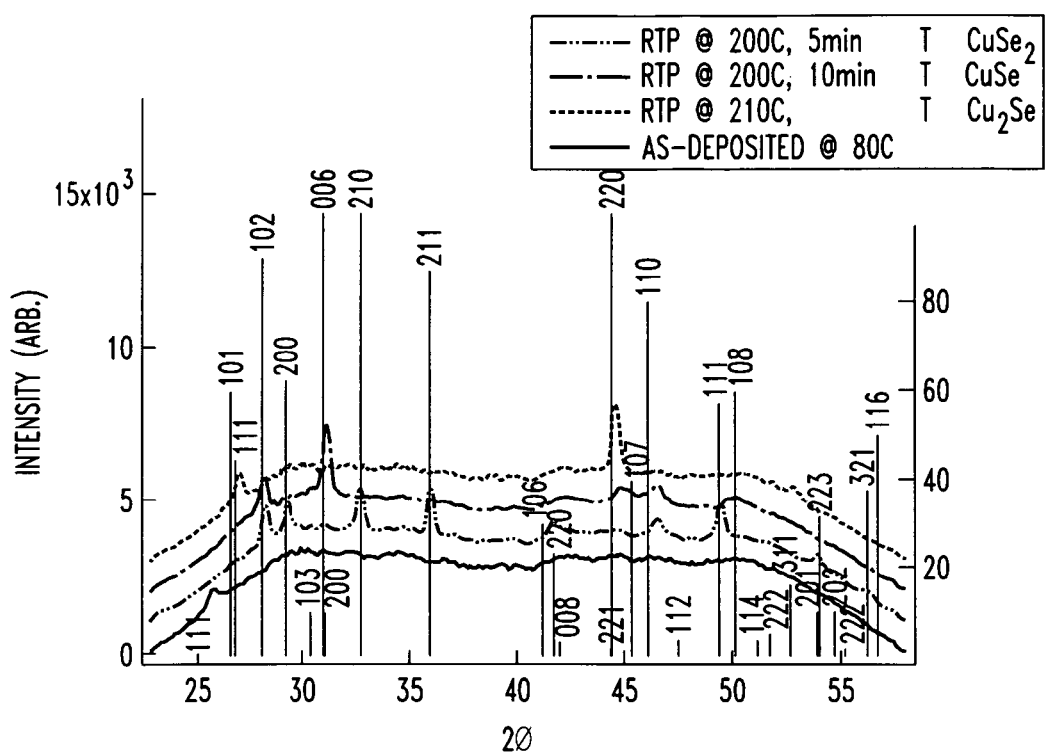
FIG. 3 is a trace view of X-ray diffraction patterns, representing three embodiments in which the percent of copper in the thin film is a function of the process temperature and duration of temperature treatment.

As previously indicated the duration of thermal processing is another factor which assists in controlling the atomic ratio of copper to selenium. Generally, as shown for example in FIG. 3, the longer the duration of thermal processing at a given temperature, the higher the copper to selenium atomic ratio. Thus, as shown in FIG. 3, for a given temperature (i.e. 200° C.), the longer the duration of thermal processing (ten minutes vs. five minutes), the higher the atomic ratio of copper to selenium (i.e. 1:1 vs. 1:2).

The variance of temperature and duration can affect the content of the deposited precursor composition as follows. Assuming the precursor composition is prepared as shown in FIG. 1, then the precursor composition may be deposited under heating at a temperature, for example, of 180° C. for five minutes. The resulting film may be analyzed by X-ray diffraction (see FIG. 3) and/or Raman Spectroscopy (see FIG. 4). If the atomic ratio of copper to selenium favors the species $CuSe_2$, then the temperature of the deposition step may be raised which favors a higher copper content. In addition or alternatively, the duration of the thermal treatment may be increased (e.g. from five to ten minutes) which likewise favors a higher copper content.

Conversely, if the copper-selenium atomic ratio of the initial deposited material favors the formation of $Cu_2Se$, the temperature of the deposition and/or the duration of the thermal treatment step may be decreased to thereby favor a higher selenium content.

Primary amines such as hydrazine and liquid alkylamines (e.g. propylamine) are used as the solvent for the starting copper selenide compound to form the preliminary precursor composition. The term "preliminary precursor composition" means the mixture of primary amine and starting copper selenide material prior to the removal of the precipitate ($Cu_2Se$). [The amount of primary amine (e.g. hydrazine) is greater than a stoichiometric amount, e.g., in a large excess (e.g. about 60:1 weight ratio)]. Hydrazine is not a commonly used solvent because there are safety issues concerned with its use. In the present process, hydrazine can be at least substantially recovered during thermal treatment of the precursor composition thereby enabling its use in the present process.

To reduce the amount of hydrazine needed to dissolve the copper selenide, a secondary amine such as ethylene diamine may be used as a cosolvent, or additional cosolvents such as water, lower alkanols preferably having 1-6 carbon atoms (e.g. methanol) and glycols (e.g. ethylene glycol) may also be used. The function of the cosolvent is to enable the reaction to proceed with a reduced amount of the primary amine. The amount of the cosolvent may be up to the amount of the primary amine.

In an exemplary embodiment, the precursor composition can be deposited in a single step heat treating method without resorting to multiple step processes in which the last heating step is rapid thermal processing (RTP). In particular, the solution of the primary amine e.g. hydrazine (with or without the secondary amine e.g. ethylene diamine) and copper selenide may be heated and converted directly to the desirable copper selenide species as the solution is being deposited on the substrate.

Rapid thermal processing (RTP) is defined herein as a heating regimen in which the target film is heated to the desired temperature in a short time, e.g., no more than ten minutes. The desired temperature is maintained until the heating process is completed.

In an exemplary deposition of liquid based precursor materials, such as described in WO 2008/057119 and WO 2008/063190, the precursor material is deposited on the substrate to form a thin film. Thereafter, the film is annealed at high temperatures (i.e. 350° C.) to yield a copper selenide film containing $Cu_2Se$ as the predominant species. In the present process, heating may be conducted while the precursor composition is being deposited on the substrate in a single step process.

It will be understood that the one step heating process is exemplary and not required. Thus, the precursor compositions described herein may be initially deposited on a substrate at relatively low temperatures, about 80° C. to 100° C. and thereafter treated at higher temperatures including rapid thermal processing to convert the initial copper selenide composition to the CuSe in relatively pure form.

The present process does not produce significant amounts of copper oxides and particularly the precursor compositions and films formed from such compositions contain no detectable oxygen (i.e. less than about 0.1% of oxygen).

The CuSe containing precursor composition representing an embodiment makes efficient use of selenium and in an exemplary embodiment obviates the need for multiple heating steps. Because CuSe is produced in relatively pure form, the precursor compositions can be used effectively to facilitate the formation of, for example, $CuInSe_2$ with large crystal grains in a solid state reaction with $In_2Se_3$.

EXAMPLES

Specific embodiments will now be further described by the following, nonlimiting examples which will serve to illustrate in some detail various features.

The following examples are included to facilitate an understanding of ways in which an embodiment may be practiced. It should be appreciated that the examples which follow represent embodiments discovered to function well in practice. However, it should be appreciated that many changes can be made in the exemplary embodiments which are disclosed while still obtaining like or similar results without departing from the spirit and scope of the claims. Accordingly, the examples should not be construed as limiting the scope of the claims.

Example 1

A preliminary precursor composition based on copper selenide was prepared by adding 1.42 g of commercial grade CuSe powder to 80 ml of hydrazine under stirring for three days. During this time a precipitate forms comprised of $Cu_2Se$. A solution having a clear green color and comprised of $CuSe_2$ in hydrazine was isolated by removing the precipitate by filtration and/or centrifugation to form a precursor composition. A representation of the reaction to yield the preliminary precursor composition and the precursor composition is shown in FIG. 1.

Example 2

Figure 2:
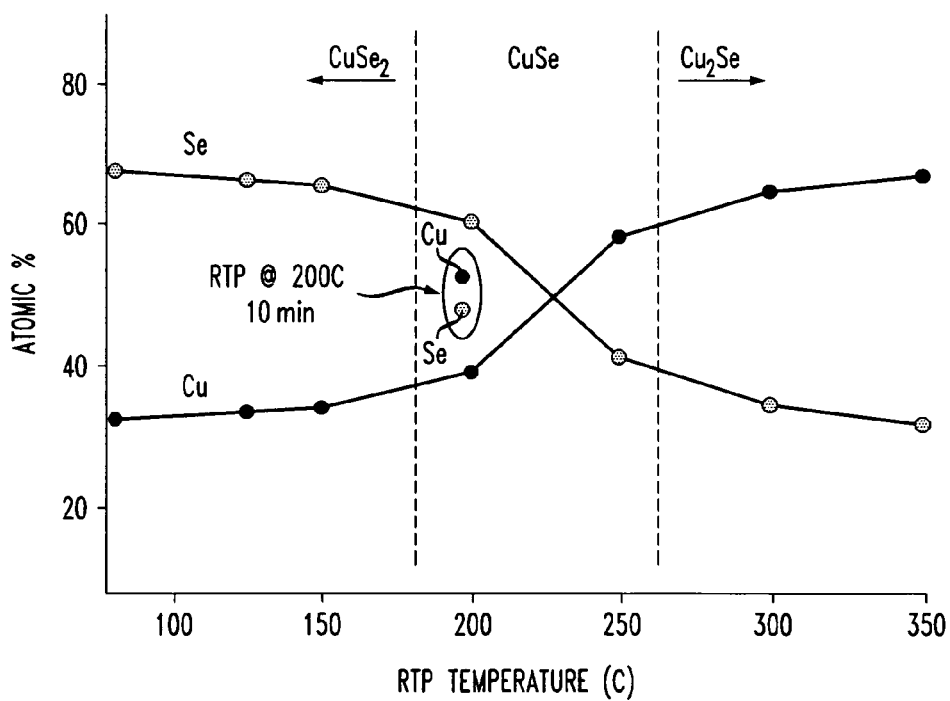
FIG. 2 is a trace view of atomic percent of copper and selenium as a function of processing temperature for a given time, representing exemplary embodiments.

Seven samples of the precursor composition prepared in accordance with Example 1 were heated to temperatures of up to 350° C. for five minutes as shown in FIG. 2. Sample 1 was maintained at room temperature and analyzed for copper selenide content. Sample 1 measured about 33% copper and 67% selenium. Samples 2 and 3, heated to about 125° C. and 150° C., respectively, showed a slight increase in copper content to about 35%. In each of Samples 1-3, the predominant copper selenide species is $CuSe_2$.

Sample 4 was heated to 200° C. and analyzed for copper selenide content. The amount of copper was approximately 39% and the amount of selenium was approximately 61%, representing a mixture of $CuSe_2$ and CuSe. When the duration of heating was extended to ten minutes (Sample 4A), the copper content increased and the selenium content decreased.

Sample 5 was heated to 250° C. and determined to contain approximately 60% copper and 40% selenium. Sample 6 was heated to 300° C. and found to contain about 65% copper and about 35% selenium, while sample 7 was heated to 350° C. and found to contain about 67% copper and 33% selenium. Samples 6 and 7 contained a predominant amount of $Cu_2Se$.

Thus, Samples 1-3 showed a predominant amount of selenium and are associated with the copper selenide species $CuSe_2$. Samples 6 and 7 showed a predominant amount of copper and are associated with the species $Cu_2Se$. Of particular interest are samples 4 and 5 and the temperature range of from about 180° C. to 240° C. where the predominant species is CuSe which is an exemplary species for forming CIS and CIGS absorber layers.

The data shown in the XRD scan of FIG. 3 shows films deposited at relatively low temperatures up to about 150° C. are structurally amorphous. At these temperatures the solvent is driven off and a composition corresponding to $CuSe_2$ is observed but no peaks due to crystalline phases are observed by X-ray diffraction (XRD). As the temperature is raised, there is a shift in the copper selenide content favoring increased amounts of copper and decreased amounts of selenium, resulting in a transition from $CuSe_2$ to CuSe. In the range of about 180° C. to about 240° C., the predominant species of copper selenide is CuSe. Above 250° C., the copper content continues to increase until the predominant species is Cu$_2$Se.

Thus, heating to a temperature of 180° C. to about 240° C. favors the exemplary species CuSe. However, it is also important to note that the rate of selenium loss can be controlled by controlling not only the temperature but the duration of the heating process. This is of particular interest in the temperature range of 180° C. to 210° C. as shown in FIG. 3.

FIG. 3 shows an X-ray diffraction scan of a sample prepared in accordance with Example 1. The sample precursor composition was deposited at 80° C. on a glass substrate and shown to have a relatively low copper to selenium atomic ratio and no peaks due to the presence of crystalline phases in the XRD. When the temperature was raised to 200° C. for five minutes, the atomic ratio of copper to selenium increased slightly and crystalline CuSe$_2$ was observed by XRD. As the temperature of 200° C. was maintained for an additional five minutes (i.e. heating at 200° C. for a total of ten minutes), the copper to selenium ratio increased to an extent that the predominant crystalline species observed in the XRD scan changed from CuSe$_2$ to CuSe. At a slightly higher temperature (210° C.) held for ten minutes, Se loss was even faster and Cu$_2$Se was the predominant crystalline species observed by XRD.

Thus, within a target zone of about 180° C. to 210° C., the duration of heating can be varied to further control the copper selenium content.

Example 3

Another sample (Sample 8) was prepared in a manner similar to Example 1, except that the solvent used to dissolve the starting copper selenide material was a 1:1 weight ratio of hydrazine and ethylene diamine. The molecular signature shown in FIG. 4 confirms the formation of a complex due to the presence of hydrazine ligands coordinated to copper. The precipitate formed during the reaction (Cu$_2$Se) was removed by filtration and/or centrifugation to form the precursor composition.

Figure 5:
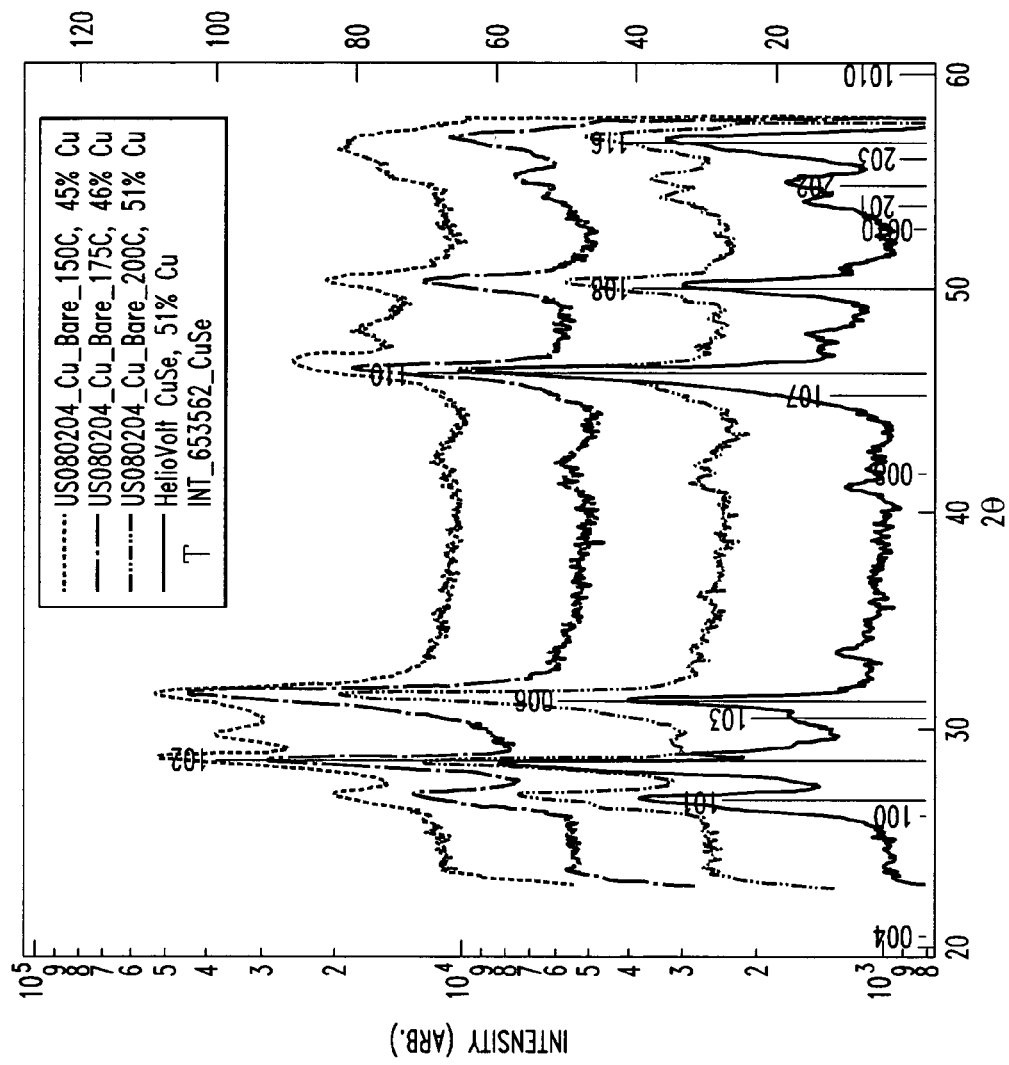
FIG. 5 is a trace view of X-ray diffraction patterns of precursor compositions heat treated at different temperatures showing changes in copper content.

The resulting precursor composition was deposited on glass substrates at a temperature of 150° C. (Sample 9), 175° C. (Sample 10), and 200° C. (Sample 11), respectively, and the temperature for each sample as deposited was maintained for 30 minutes. FIG. 5 shows X-ray diffraction scans of Samples 9-11 and a CuSe film deposited by physical vapor deposition. As shown in FIG. 5, films that are structurally and compositionally CuSe are made by spray deposition of the precursor composition in the temperature range of from about 150° C. to 200° C.:

Example 4

Figure 4:
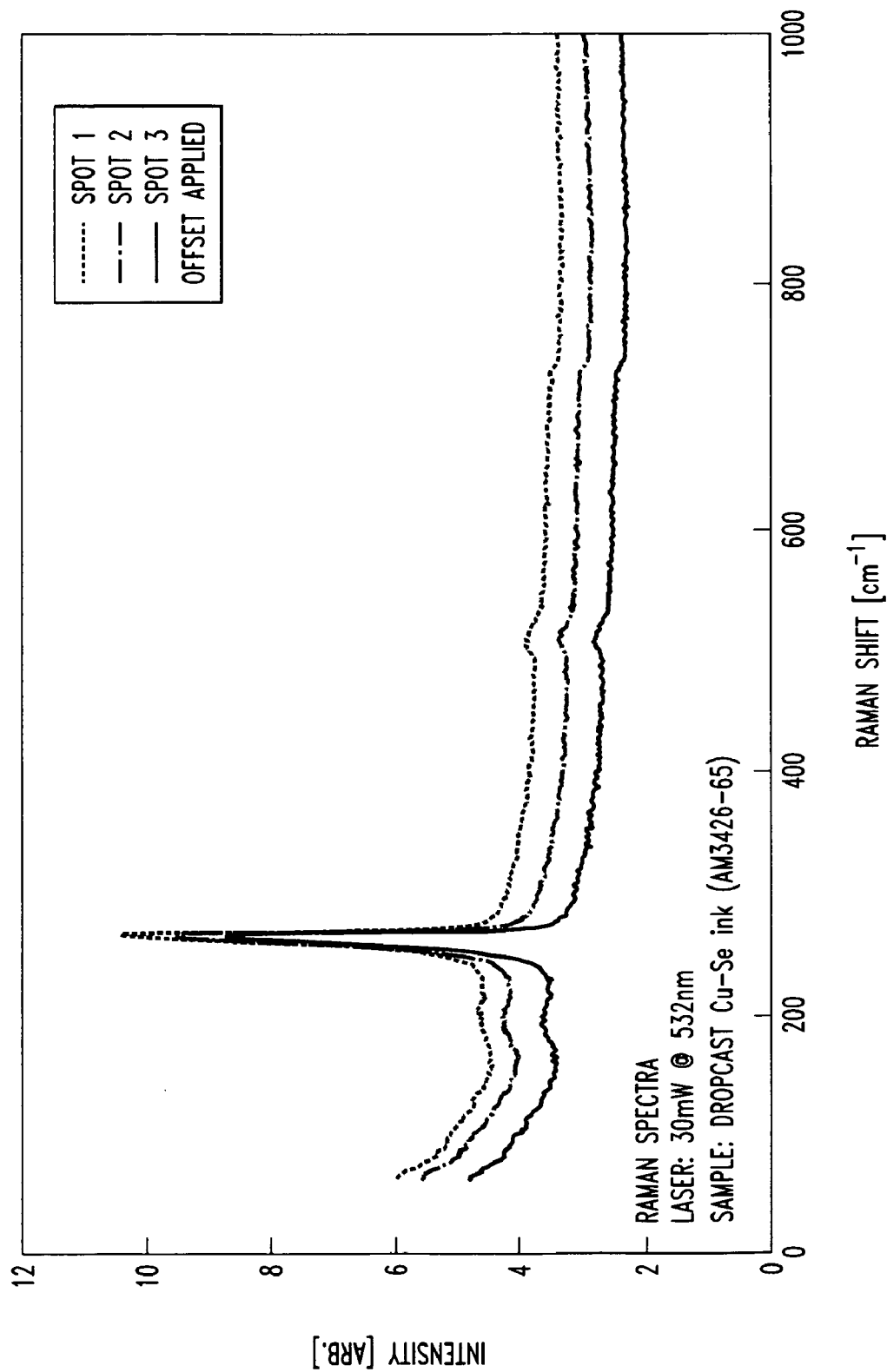
FIG. 4 is a trace view of Raman spectral data of a precursor composition, representing an exemplary embodiment.
Figure 6:
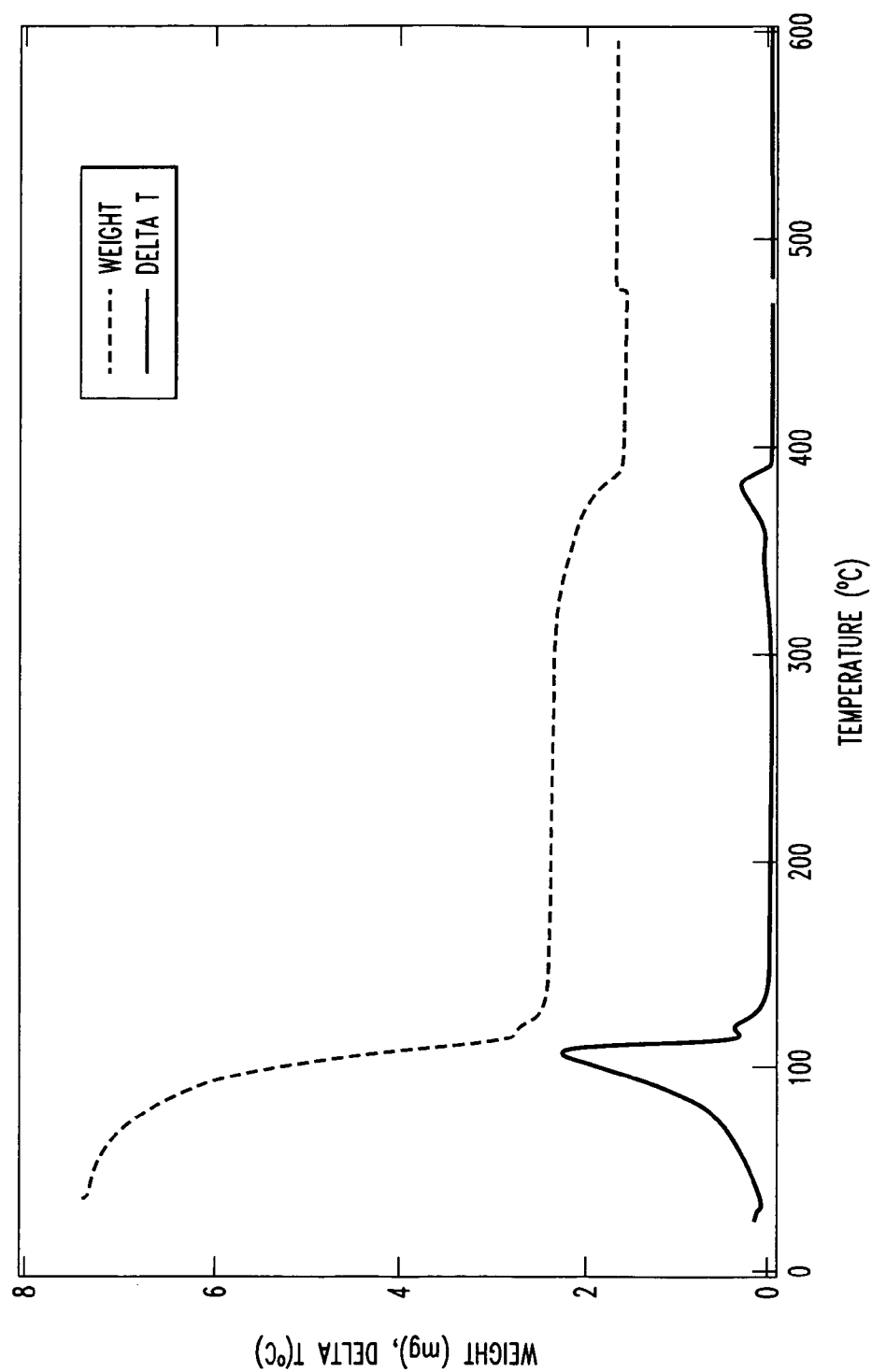
FIG. 6 is a trace view of a thermogravimetric analysis/differential thermal analysis (TGA-DTA) scan of a precursor composition, representing an exemplary embodiment.

1.42 g of CuSe (obtained from Alfa, 0.010 mol) was placed in a 250 ml round bottom flask with side-arm stopcock and magnetic stir bar. The flask was capped with a septum and evacuated and refilled with N$_2$. Then 80 ml of anhydrous hydrazine (Aldrich) was added with a polyethylene syringe. The mixture was then stirred for three days at room temperature, during which time a black, chunky material (CuSe) dissolved to give a dark colored solution and a grey precipitate (identified as Cu$_2$Se) thus forming a preliminary precursor composition. The mixture was then transferred by a stainless steel cannula to two N$_2$-purged 50 ml centrifuge tubes and separated by centrifugation at 3000 rpm for fifteen minutes. The clear, dark precursor liquid (precursor composition: Sample 12) was decanted via a cannula into a purged flask and stored under N$_2$. The color of the liquid lightened with time in storage, becoming dark green within two days and then turning to yellow over a period of a few weeks. This is thought to be due to the presence of small amounts of highly colored polyselenides that oxidize over time in these septum-capped storage flasks. ICP-AES analysis of this sample gives a Cu:Se ratio of 1:2 for this liquid and so it is formulated as CuSe$_2$ coordinated by and dissolved in hydrazine. FIG. 6 shows a TGA-DTA scan of the liquid from sample 12 after evaporation of the hydrazine solvent while FIG. 4 shows a Raman Spectrum of the thin film.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. A liquid-based preliminary precursor composition comprising:
   a solvent comprising a primary amine; and
   a solute comprising copper and selenium wherein the preliminary precursor composition is substantially free of oxygen-containing compounds.

2. The preliminary precursor composition of claim 1, wherein the primary amine is selected from the group consisting of hydrazine and liquid alkylamines.

3. The preliminary precursor composition of claim 1, wherein the primary amine is hydrazine.

4. The preliminary precursor composition of claim 1, wherein the primary amine is present in greater than a stoichiometric amount.

5. The preliminary precursor composition of claim 1 further comprising a cosolvent.

6. The preliminary precursor composition of claim 5, wherein the cosolvent is selected from the group consisting of secondary amines, lower, alkanols, and glycols.

7. The preliminary precursor composition of claim 6, wherein the cosolvent is ethylene diamine.

8. A precursor composition comprising:
   a liquid-based solvent comprising a primary amine; and
   a solute comprising copper and selenium, the precursor composition being substantially free of oxygen containing compounds and at least substantially devoid of a precipitate comprising Cu$_2$Se.

9. The precursor composition of claim 8, wherein the primary amine is selected from the group consisting of hydrazine and alkylamines.

10. The precursor composition of claim 9, wherein the primary amine is hydrazine.

11. The precursor composition of claim 8, wherein after heating has a molecular signature characterized by Raman spectrum substantially as shown in FIG. 4.

12. The precursor composition of claim 8 further comprising a cosolvent.

13. The precursor composition of claim 12, wherein the amount of the cosolvent is up to the amount of the primary amine.

14. The precursor composition of claim 8, wherein the amount of the primary amine is greater than a stoichiometric amount.

15. A thin film comprising the precursor composition of claim 8 heated to a temperature sufficient to remove the solvent.

16. The thin film of claim 15 heated to a temperature of from about 150° C. to 250° C.

17. The thin film of claim 16 heated to a temperature of from about 180° C. to 250° C.

18. The thin film of claim 15 comprising copper selenide at least substantially in the form of CuSe.

19. The thin film of claim 18 entirely in the form of CuSe.

20. The thin film of claim 15 containing substantially no oxygen or oxygen containing compounds.

21. The thin film of claim 15, which is substantially amorphous.

22. The thin film of claim 15, which is substantially crystalline.

23. The thin film of claim 15, characterized by any one of the X-ray diffraction patterns as shown in FIG. 3.

24. A method of making the liquid-based preliminary precursor composition of claim 1 comprising:
combining the solvent and the solute to form a solution; and
agitating the solution until a non-soluble product is formed.

25. A method of making the liquid-based precursor composition of claim 8 comprising:
combining the solvent and the solute to form a preliminary precursor composition;
agitating the preliminary precursor composition to form a non-soluble product; and
removing the non-soluble product to form the liquid-based precursor composition.

26. The method of claim 25 wherein the solvent is selected from the group consisting of hydrazine and alkylamines.

27. The method of claim 25 further comprising combining the solvent and a cosolvent with the solute.

28. A method of making a thin film comprising:
depositing the precursor composition of claim 8 on a substrate, and
heating the precursor composition for a time sufficient to remove the solvent.

29. The method of claim 28 further comprising heating the precursor composition to a temperature favoring the formation of CuSe.

30. The method of claim 29 further comprising conducting the heating step for a time sufficient to favor the formation of CuSe.

* * * * *